(12) United States Patent
Mueller et al.

(10) Patent No.: US 12,214,738 B2
(45) Date of Patent: Feb. 4, 2025

(54) DEVICE AND METHOD FOR REDUCING THE NUMBER OF ANALOG INPUTS AT A CONTROL DEVICE

(71) Applicant: Robert Bosch GmbH, Stuttgart (DE)

(72) Inventors: Jonathan Mueller, Stuttgart (DE); Wolfgang Fischer, Renningen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 18/042,013

(22) PCT Filed: Aug. 5, 2021

(86) PCT No.: PCT/EP2021/071828
§ 371 (c)(1),
(2) Date: Feb. 17, 2023

(87) PCT Pub. No.: WO2022/037949
PCT Pub. Date: Feb. 24, 2022

(65) Prior Publication Data
US 2023/0322172 A1   Oct. 12, 2023

(30) Foreign Application Priority Data

Aug. 20, 2020   (DE) ............... 10 2020 210 555.3

(51) Int. Cl.
*B60R 16/03*   (2006.01)
*B60L 50/10*   (2019.01)
*B60R 16/023*   (2006.01)

(52) U.S. Cl.
CPC .......... *B60R 16/0315* (2013.01); *B60L 50/10* (2019.02); *B60R 16/023* (2013.01)

(58) Field of Classification Search
None
See application file for complete search history.

(56) References Cited

U.S. PATENT DOCUMENTS

| | | | |
|---|---|---|---|
| 4,562,545 A | 12/1985 | Hasegawa | |
| 5,583,420 A * | 12/1996 | Rice | H02P 9/30 322/28 |
| 6,018,200 A | 1/2000 | Anderson et al. | |
| 10,490,060 B2 | 11/2019 | Motz et al. | |
| 2020/0287500 A1* | 9/2020 | Fukushima | H02P 27/04 |
| 2021/0083683 A1* | 3/2021 | Ali | H03M 1/0641 |

(Continued)

FOREIGN PATENT DOCUMENTS

| | | |
|---|---|---|
| DE | 19524838 C2 | 3/2002 |
| DE | 102014213077 A1 | 1/2016 |
| DE | 102016201870 A1 | 8/2017 |

(Continued)

OTHER PUBLICATIONS

Translation of International Search Report for Application No. PCT/EP2021/071828 dated Nov. 22, 2021 (2 pages).

*Primary Examiner* — Jared Fureman
*Assistant Examiner* — Aqeel H Bukhari
(74) *Attorney, Agent, or Firm* — Michael Best & Friedrich LLP

(57) ABSTRACT

The invention relates to a device and a method for reducing the number of analog inputs at a control device (16). It is proposed that at least two physical signals, which are different from each other, are transmitted at an analog input of the control device (16).

15 Claims, 1 Drawing Sheet

(56) References Cited

U.S. PATENT DOCUMENTS

2022/0124157 A1* 4/2022 Binder .................... G07C 3/02

FOREIGN PATENT DOCUMENTS

| DE | 102017103873 A1 | 8/2018 |
| DE | 102017005137 A1 | 12/2018 |
| DE | 112017002989 T5 | 2/2019 |
| EP | 0406182 A1 | 1/1991 |
| GB | 2282469 A | 4/1995 |
| JP | S547081 A | 1/1979 |
| JP | H10153159 A | 6/1998 |
| JP | 2005328690 A | 11/2005 |
| JP | 2009512409 A | 3/2009 |
| JP | 2016149904 A | 8/2016 |
| JP | 2017031808 A | 2/2017 |
| JP | 2018102067 A | 6/2018 |
| JP | 20180105164 A | 7/2018 |
| WO | 2019107030 A1 | 6/2019 |

* cited by examiner

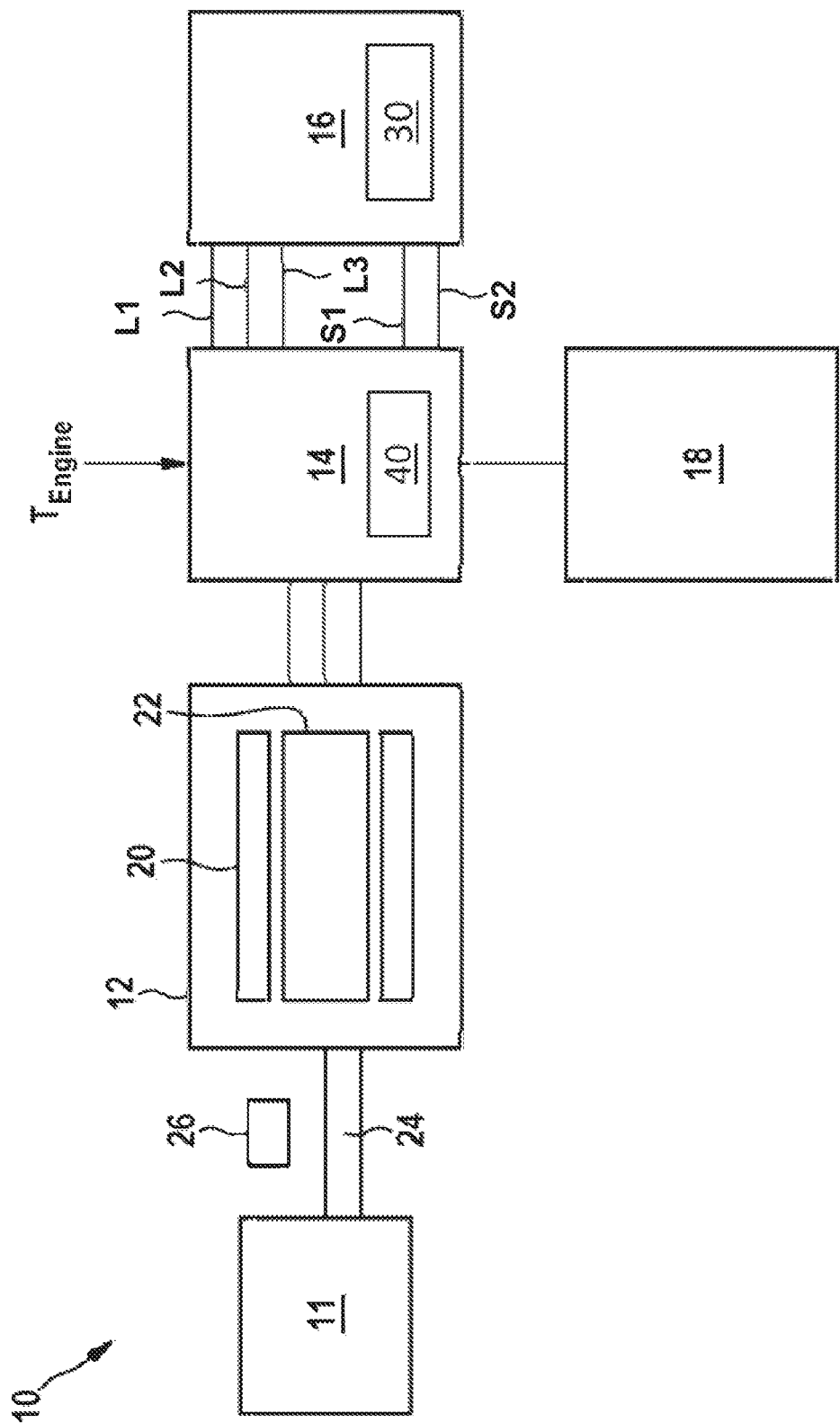

DEVICE AND METHOD FOR REDUCING THE NUMBER OF ANALOG INPUTS AT A CONTROL DEVICE

BACKGROUND OF THE INVENTION

The invention relates to a device and a method for reducing the number of analog inputs at a control device.

DE 11 2017 002 989 T5 describes a way of multiplexing input signals in a control device in order to reduce the size and complexity of connectors. Primarily digital signals are being multiplexed in this case. In DE 11 2017 002 989 T5, on the other hand, a separate multiplexer is provided.

U.S. Pat. No. 10,490,060 B2 describes a system in which a variety of sensor data is input into an ECU as analog signals, wherein the various sensor signals are multiplexed in a multiplexer based on time or frequency. A separate multiplexer is provided in DE 11 2017 002 989 T5 as well, however.

SUMMARY OF THE INVENTION

The invention relates to a circuit comprising a control device, in particular for two-wheeled vehicles. In order to limit the number of analog inputs or to be able to process more signals when there are too few analog inputs, multiple analog signals are to be transmitted to the control device via only a single line.

A number of different types of signal multiplexing are proposed for this purpose. On the one hand, signals can be time-division multiplexed if the signals are not needed at the same time. On the other hand, frequency-division multiplexing, for example, can be carried out.

The advantage of the invention is a solution for making x analog signals available for a control device in a two-wheeled vehicle with less than x free inputs.

For an integrated starter generator (ISG) application, for example, two analog current measurements are needed. The two phase currents are measured and transmitted to the control device via two lines. After starting there is no longer a need for the current measurement, so that other signals, such as an analog signal from the engine temperature sensor or the like, can be transmitted to the control device via the lines when the engine is running instead of the current information. Thus, existing analog inputs of the control device can be used and there is no need to free pins. On typical control devices, there are usually too few pins available for new applications.

It is moreover also conceivable to multiplex two current signals via one line. However, since both currents are needed at the same time, it is no longer possible here to select a different signal based on the engine speed ranges at different times; instead both signals have to be placed on the line together. For example, by frequency-division multiplexers.

BRIEF DESCRIPTION OF THE DRAWINGS

FIG. 1 shows a circuit for carrying out the method according to the invention for reducing the number of analog inputs at a control device.

DETAILED DESCRIPTION

FIG. 1 schematically shows a system 10 comprising an internal combustion engine 11, an electric machine 12, a power converter 14 and a control device 16 configured as an engine control device, with which a method according to the invention can be carried out.

The electric machine 12 comprises a rotor 20 and a stator 22. The rotor 20 is connected to a crankshaft 24 of the internal combustion engine 11 in a rigid and rotationally fixed manner.

In the case of a suitably configured crankshaft, for example, a rotational speed sensor 26 can be used to detect a rotational speed and an absolute position. These values can then be supplied to the control device 16.

The power converter 14 is configured as an inverter, referred to herein simply as inverter 14, and is connected to the control device 16 via control lines L1, L2, L3. The inverter 14 is furthermore electrically connected to a battery 18.

In the embodiment example, two analog signals pass from the inverter 14 to the control device 16 via a first analog input S1 and a second analog input S2, illustrated by lines.

In the case of an integrated starter generator application, for example for two-wheeled vehicles such as motorcycles or the like, the signals S1, S2 are current measurement values. The two phase currents are measured and transmitted to the control device via the two analog inputs S1, S2.

The signals are routed to A/D converters on a circuit board 30 in the control device 16, so that a processor in the control device 16 can read out and evaluate the current measurement values.

In the case of an integrated starter generator application, for example for two-wheeled vehicles such as motorcycles or the like, an analog current measurement is required only during activation in order to bring the internal combustion engine 11 from standstill to a suitably high rotational speed. Suitable rotational speeds here are in a range between 100 and 400 rpm, in particular at 300 rpm. The rotational speeds are preferably less than 1000 rpm. The current signals include information about the position of the rotor 20. If the rotor 20 has reached a rotational speed within the aforementioned range, this position information is made available via the rotational speed detection system consisting of the rotational speed sensor 26 and a sensor wheel. After starting there is no longer a need for the current measurement, so that other signals, such as an analog signal from the engine temperature sensor or the like, can be transmitted to the control device via the lines when the engine is running instead of the current information.

The invention proposes a solution that occupies an analog input of control device 16 with two different physical signals.

In order to limit the number of analog inputs or to be able to process more signals when there are too few analog inputs, multiple analog signals are to be transmitted to the control device 16 via only one line. A number of different types of signal multiplexing are proposed for this purpose. On the one hand, signals can be time-division multiplexed if the signals are not needed at the same time. On the other hand, frequency-division multiplexing, for example, can be carried out.

Thus, in the embodiment example according to the invention, a signal from an engine temperature sensor $T_{Engine}$ passes to the inverter 14 instead of directly to the control device 16. There is therefore no need for an analog connection on the control device 16.

The inverter 14 internally comprises a logic 40. In the case of an activation or starter operation, the internal logic 40 is suitable for transmitting the current signals of two phases of the electric machine to the control device 16 via the two analog inputs S1, S2.

In normal operation, i.e. when the internal combustion engine 11 is running and the electric machine 12 is producing electricity, the engine temperature signal is instead transmitted to the control device 16 via one of the two input S1, S2, by way of non-limiting example the first analog input S1.

Other signals, such as the signal from a lambda probe, a roll-over switch or an air temperature sensor, can also be used instead of the engine temperature signal. Digital inputs can alternatively be used as well, if the analog inputs of the control device can accordingly be reconfigured to digital inputs.

A time-division multiplexing approach thus makes it possible to eliminate analog pins on the control device 16.

For this purpose, it is necessary for the control device 16 to detect which signal is currently present at which analog pin.

This problem can be solved, for example, in that the inverter 14 transmits the current signal only up to a certain engine speed. Example: the current signal is transmitted by the inverter 14 up to an engine speed of approximately 1000 rpm. At engine speeds >1000 rpm, in particular above 1500 rpm, a temperature signal is transmitted. The signal from the current sensor of the inverter 14 provides the information about the engine speed. The frequency of the phase currents is proportional to the rotational speed of the rotor and thus the crankshaft of the internal combustion engine.

No input signal is present at the "Inverter Actuation" input prior to the start of ISG activation.

High-frequency PWM switching is used during ISG activation.

A minimum frequency at the "Inverter Actuation" input can be a switching condition for the output of the current instead of the temperature. This means that the required engine temperature is available prior to the start of activation and during combustion operation. The current temperature information has to be foregone only when starting and thus for a negligibly short amount of time.

Instead of a time-division multiplexing approach, it is also possible to use a frequency-division multiplexing approach.

In this case, both a low-frequency signal (for example a temperature signal) and the current signal are transmitted, wherein the current signal is transmitted in a higher frequency band. This has the advantage that both signals are available in the control device 16 at any given time. In this case, the current signal is modulated to a carrier frequency via amplitude modulation. The carrier frequency is 5 kHz, for example. However, it is also conceivable that the carrier frequency is 20 kHz.

It is also conceivable for the low-frequency signal to be modulated to a carrier frequency. Both signals are read into the control device 16 via high-frequency sampling. This has the advantage that both signals are available at and in the control device 16 at any given time.

However, it is also conceivable for two high-frequency current signals to be transmitted on one line via frequency-division multiplexing, wherein both high-frequency signals have to be transmitted on one line. The disadvantage here is that more resources are required in the control device 16.

Other modulation methods known to those skilled in the art can be used as well.

The method is not limited to the combination of individual signals. If necessary, all current information of the inverter 14 can be "multiplexed" with suitable signals. The number of current measuring channels can thus be increased as needed without having to increase the number of analog pins in the control device 16.

If the switching conditions are suitable, more than two signals can be placed on one line. It is conceivable, for example, that any information is on a line prior to an event. As soon this information is no longer necessary, a current signal is transmitted instead. Once a respective rotational speed is reached, a third piece of information, such as the lambda signal, which is only relevant when the engine is running, is transmitted.

The time-division and the frequency-division multiplexing approaches can both be implemented in digital form using a suitable digital computer in the hardware of the inverter 14. If such a computer is not available, a suitable implementation can also be provided in analog hardware.

The invention claimed is:

1. A method for reducing a number of analog inputs at a control device (16) with a power converter (14) which is configured as an inverter, the method comprising:
   transmitting a first signal via a first analog input of the control device (16) during a starter operation, and
   transmitting a second signal, different from the first signal at the first analog input of the control device (16) during a running period.

2. The method according to claim 1, wherein the first signal is a current signals.

3. The method according to claim 1, wherein the starter operation, in the case of an integrated starter generator application, includes bringing an internal combustion engine (11) from a standstill to a rotational speed which is in a range between 100 and 400 rpm.

4. The method according to claim 3, wherein, in the case of an integrated starter generator application, the first signal comprises multiple signals associated with two phase currents that are measured and transmitted to the control device via two separate analog inputs S1, S2.

5. The method according to claim 4, wherein, after the starter operation, there is no longer a need for the at least one of the multiple signals, therefore the second signal is transmitted to the control device via at least one of the two analog inputs when the engine is running, wherein existing analog inputs of the control device (16) are used.

6. The method according to claim 5, wherein the second signal includes an analog signal from an engine temperature sensor.

7. The method according to claim 1, wherein the power converter (14) comprises an internal logic (40) configured to transmit the first signal as current signals of phases of an electric machine to the control device (16) via two separate analog inputs S1, S2.

8. The method according to claim 1, further comprising placing the first and second signals on one analog input by frequency-division multiplexers.

9. A system (10) comprising:
   an internal combustion engine (11),
   an electric machine (12),
   a power converter (14) configured as an inverter, and
   a control device (16) configured as an engine control device and electrically coupled to the power converter (14),
   a first analog input located at the control device (16), wherein
   the power converter (14) transmits at least two physical signals at the first analog input, a first signal transmitted during an activation period and a second signal transmitted during a running period separate from the activation period, wherein the first and second signals are different from one another.

10. The system (10) according to claim 9, wherein the power converter (12) is electrically connected to a battery (18).

11. The system (10) according to claim 10, wherein the electric machine (12) comprises a rotor (20) and a stator (22), wherein the rotor (20) is connected to a crankshaft (24) of the internal combustion engine (11) in a rigid and rotationally fixed manner.

12. The system (10) according to claim 9, wherein the power converter (12) is configured as an inverter and is connected to the control device (16) via control lines (L1, L2, L3).

13. A method for transmitting an analog signal to a control device, the method comprising:
reducing a number of analog inputs required for signal transmission by transmitting at least one starting signal via an analog input of the control device during an activation period, and transmitting a running signal, different from the at least one starting signal, at the same analog input of the control device during a running period separate from the activation period.

14. The method of claim 13, wherein the at least one starting signal is two signals associated with two phase currents, each of the two signals received at separate analog inputs.

15. The method of claim 14, wherein during the running period one of the two signals is switched to the running signal.

* * * * *